US012669531B2

(12) United States Patent (10) Patent No.: US 12,669,531 B2
Quartiroli (45) Date of Patent: Jun. 30, 2026

(54) INTEGRATED SENSOR AND METHOD OF TIMING MONITORING IN AN INTEGRATED SENSOR

(71) Applicant: STMICROELECTRONICS S.r.l., Agrate Brianza (IT)

(72) Inventor: Matteo Quartiroli, Certosa di Pavia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 411 days.

(21) Appl. No.: 18/348,993

(22) Filed: Jul. 7, 2023

(65) Prior Publication Data

US 2024/0019475 A1 Jan. 18, 2024

(30) Foreign Application Priority Data

Jul. 18, 2022 (IT) .......................... 102022000015073

(51) Int. Cl.
G01R 29/12 (2006.01)
G01R 23/02 (2006.01)
(52) U.S. Cl.
CPC ............. G01R 29/12 (2013.01); G01R 23/02 (2013.01)
(58) Field of Classification Search
CPC .. H03M 1/124; H03M 1/1245; H03M 1/1255; G06F 1/04; G06F 1/1613;
(Continued)

(56) References Cited

U.S. PATENT DOCUMENTS 6,915,219 B2 * 7/2005 Premerlani ........ G01R 19/2513
702/58
8,957,796 B2 * 2/2015 Waltari ................... H03L 7/093
341/120
(Continued)

FOREIGN PATENT DOCUMENTS

EP 2980609 A1 2/2016
KR 20110061750 A 6/2011
KR 101424500 B1 * 8/2014 ................ H02J 9/06

OTHER PUBLICATIONS

Rowe et al., "Low-power Clock Synchronization using Electromagnetic Energy Radiating from AC Power Lines," SenSys '09, Nov. 4-6, 2009, Berkeley, CA, USA, pp. 211-224. (15 pages).
(Continued)

*Primary Examiner* — Huy Q Phan
*Assistant Examiner* — David B Frederiksen
(74) *Attorney, Agent, or Firm* — Seed Intellectual Property Law Group LLP

(57) ABSTRACT

The integrated sensor has a clock which provides a clock signal having a clock frequency; a digital detector which detects a power grid signal and generates a reference digital signal indicative of the power grid signal and having a sample rate which is a function of the clock frequency; and a timing monitoring stage which receives the reference digital signal and a nominal signal indicative of a nominal timing of the reference digital signal. The timing monitoring stage also compares the reference digital signal with the nominal signal and, in response, provides an error signal indicative of a timing error between the reference digital signal and the nominal signal.

20 Claims, 5 Drawing Sheets

(58) Field of Classification Search
     CPC .... G06F 1/1633; G06F 1/1684; G06F 1/1694;
                  G06F 3/05; G01R 19/25; G01R 19/2513;
                          G01R 23/02; G01R 29/12
     See application file for complete search history.

(56)                    References Cited

U.S. PATENT DOCUMENTS

| | | | |
|---|---|---|---|
| 2002/0003847 A1* | 1/2002 | Yamamoto | G11B 20/1403 |
| | | | 375/344 |
| 2005/0218955 A1* | 10/2005 | Kurd | H03L 7/093 |
| | | | 327/291 |
| 2006/0157703 A1* | 7/2006 | Kodama | G01R 31/002 |
| | | | 257/48 |
| 2006/0247874 A1* | 11/2006 | Premerlani | G01R 19/2513 |
| | | | 702/64 |
| 2014/0232516 A1 | 8/2014 | Stivoric et al. | |
| 2016/0223592 A1* | 8/2016 | Vos | G01R 15/181 |
| 2016/0342781 A1 | 11/2016 | Jeon | |
| 2018/0329450 A1* | 11/2018 | Jin | G06F 1/12 |
| 2019/0052281 A1* | 2/2019 | Thompson | H04L 27/066 |
| 2021/0028791 A1* | 1/2021 | Xu | H03M 1/121 |

OTHER PUBLICATIONS

Yan et al., "Wearables Clock Synchronization Using Skin Electric Potentials," *IEEE Transactions on Mobile Computing* 18(12):2964-2998, Dec. 2019.

* cited by examiner

INTEGRATED SENSOR AND METHOD OF TIMING MONITORING IN AN INTEGRATED SENSOR

BACKGROUND

Technical Field

The present disclosure relates to an integrated sensor and to a method of timing monitoring in an integrated sensor.

Description of the Related Art

As is known, electronic apparatuses are widespread, used for example both in the consumer electronics field and in the industrial and automotive fields, which incorporate one or more sensors configured to each detect one or more physical quantities associated with the use of the respective electronic apparatus.

For example, the one or more sensors may be accelerometers, gyroscopes, temperature, pressure, electrical resistance, mechanical stress, deformation sensors.

It is also known to provide such sensors using MEMS technology, which allows sensors having small dimensions, low energy consumption and high detection accuracy to be obtained.

A sensor converts a physical quantity into an electrical signal, of analog type, whose trend over time is a function of the trend over time of the respective detected physical quantity.

The sensor comprises a clock which provides a clock signal and a conversion circuit which is controlled by the clock signal and discretizes the analog signal, thereby generating a digital signal.

In sensors, the sample rate of the digital signal is desired to be equal to a nominal value, for example chosen by a user according to the specific application.

As known, non-idealities in the manufacturing process, temperature variations and aging phenomena cause deviations in the clocks, in particular frequency deviations, with respect to a design value.

Since the conversion circuit is controlled by the clock signal, the deviations of the clock cause deviations of the sample rate from the nominal value.

In this regard, there are known methods of clock trimming which allow the frequency thereof to be trimmed, so that the sample rate of the digital signal remains equal to the nominal value. However, these known methods may be performed during a test step of the device, for example before being put on the market, or at specific moments during the sensor lifetime.

These known methods provide for the use of devices external to the sensor to detect an error between the effective sample rate and the nominal sample rate of the digital signal.

Furthermore, these methods cannot be performed at runtime, without interrupting the operation of the sensor.

BRIEF SUMMARY

Various embodiments of the present disclosure overcome the drawbacks of the prior art.

According to the present disclosure, an integrated sensor and a method of timing monitoring are provided herein. The integrated sensor has a clock which provides a clock signal having a clock frequency; a digital detector which detects a power grid signal and generates a reference digital signal indicative of the power grid signal and having a sample rate which is a function of the clock frequency; and a timing monitoring stage which receives the reference digital signal and a nominal signal indicative of a nominal timing of the reference digital signal. The timing monitoring stage compares the reference digital signal with the nominal signal and, in response, provides an error signal indicative of a timing error between the reference digital signal and the nominal signal.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

DETAILED DESCRIPTION

Unless otherwise specified, reference will be made hereinafter to the frequency of a discretized (digital) signal to indicate the sample frequency thereof, i.e., the data rate at which the samples of the discretized signal are provided at output by the respective block that generated it.

Figure 1:
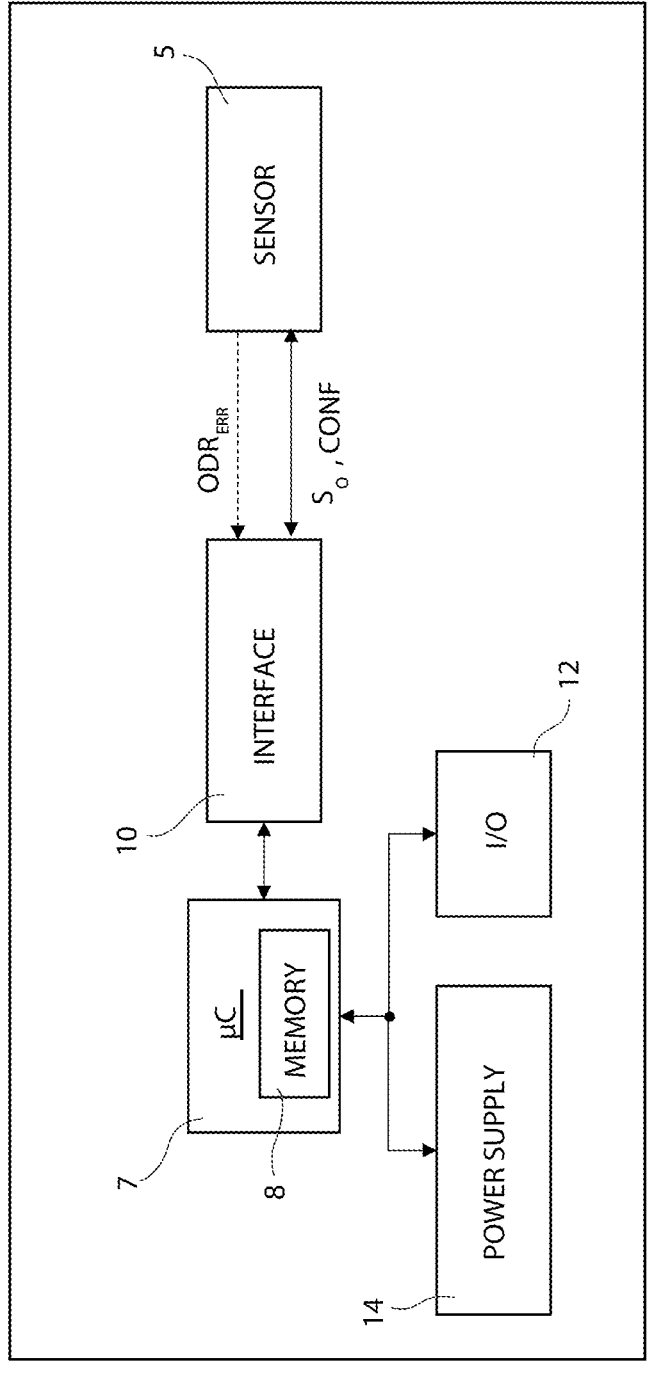
FIG. 1 shows a block diagram of an electronic apparatus comprising the present sensor.

FIG. 1 schematically shows an electronic system or apparatus 1, for example a smartphone, a wearable device, an augmented or virtual reality device, an apparatus for monitoring one or more physical quantities, for example for monitoring vibrations, etc.

The electronic apparatus 1 comprises one or more sensors, here a sensor 5, a control unit 7 and an interface 10, operatively coupled to each other.

The control unit 7 comprises a memory 8 and a processing unit (not shown here) and is configured to send instructions to the sensor 5, for example one or more configuration signals CONF indicative of one or more parameters useful for the operation of the sensor 5, for example as discussed below, and to receive measurement data or samples from the sensor 5 through the interface 10.

The interface 10 may be, for example, a bus of known type for transferring electrical signals.

The electronic apparatus 1 also comprises input and output peripherals 12, for example a screen, in particular of touchscreen type, one or more keys, etc., and a power supply unit 14, for example a battery. The input and output peripherals 12 and the power supply unit 14 are coupled to the control unit 7. The power supply unit 14 may also be configured to provide a supply voltage to the sensor 5, through the interface 10.

Figure 2:
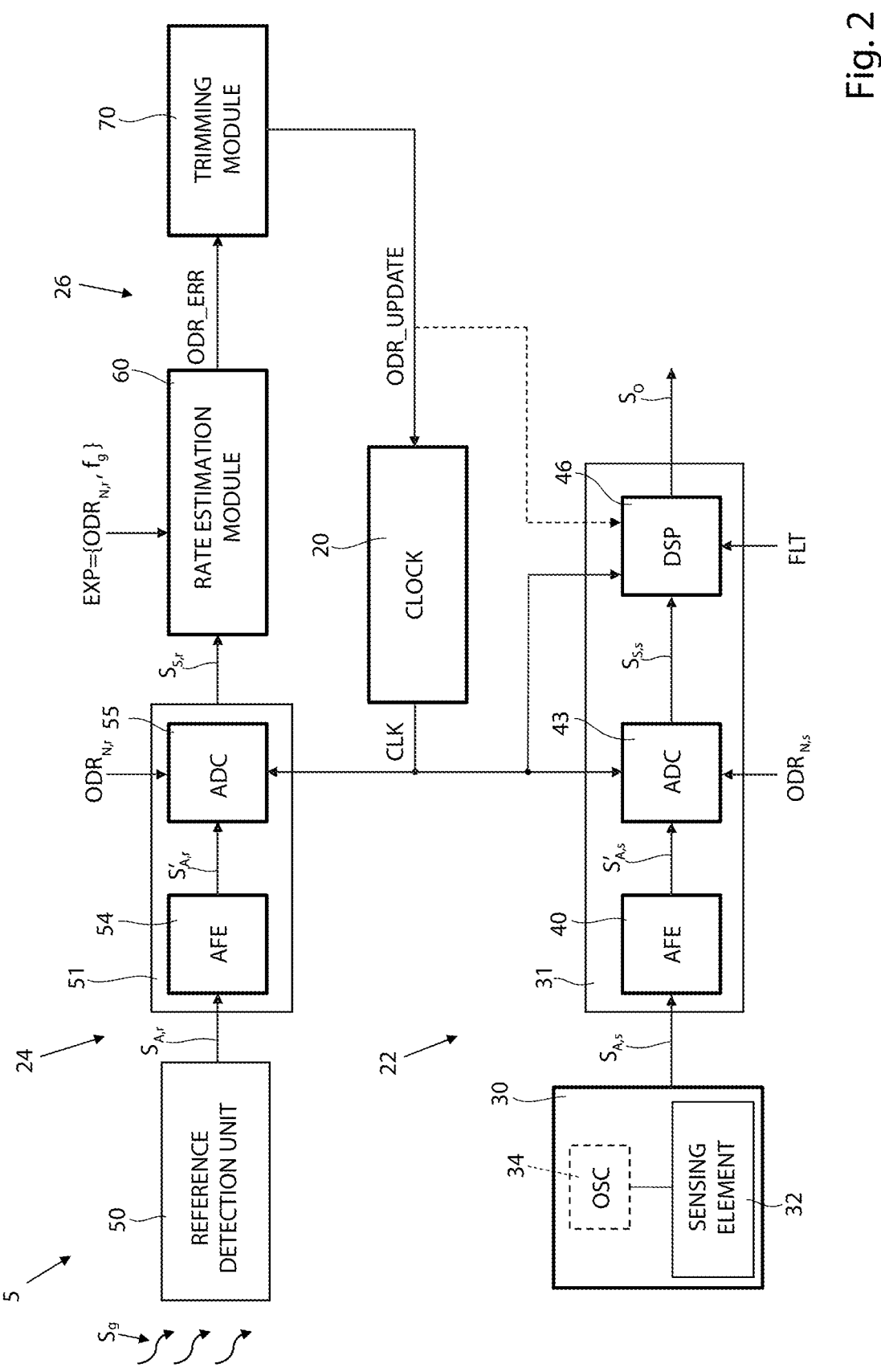
FIG. 2 shows a block diagram of the sensor of FIG. 1, according to an embodiment.

As shown in FIG. 2, the sensor 5 comprises a clock 20, a main detector 22, a reference detector 24 and a rate monitoring stage 26, mutually coupled.

The clock 20 provides a periodic signal, hereinafter clock signal CLK, in particular a square wave signal, having a clock frequency $f_{clk}$, for example of the order of a few megahertz. For example, the clock 20 may be formed by any type of known electronic oscillator, such as a voltage-controlled oscillator.

The main detector 22 and the reference detector 24 are controlled by the clock signal CLK.

The main detector 22 detects one or more physical quantities associated with the operation of the electronic apparatus 1 and provides an output signal $S_O$, of digital type, indicative of the one or more acquired physical quantities.

The samples that form the output signal $S_O$ may be provided to the control unit 7 through the interface 10 and, for example, stored in the memory 8 for subsequent processing.

In detail, the main detector 22 comprises a detection unit 30, which detects the one or more physical quantities and provides one or more electrical signals, here an analog signal $S_{A,s}$, and a processing stage 31 which receives and samples the analog signal $S_A$ and generates the output signal $S_O$.

For example, the detection unit 30 may be configured to detect acceleration, angular speed, temperature, pressure, mechanical stress, electrical resistance, etc.

In particular, in this embodiment, the sensor 5 is of MEMS type, i.e., the detection unit 30 is obtained using MEMS technology.

In detail, the detection unit 30 comprises a sensing element 32 designed according to the specific physical quantity to be detected and the specific application.

The sensing element 32 is sensitive to a variation of the physical quantity to be detected and converts the variation of the physical quantity to be detected into the analog signal $S_{A,s}$, for example according to an electrostatic, piezoresistive, piezoelectric or electromagnetic detection principle.

According to an embodiment, the detection unit 30 may also comprise a mechanical oscillator 34, here indicated by a dashed line, coupled to the sensing element 32.

The mechanical oscillator 34 comprises a movable and/or deformable structure, for example in an elastic manner, such as a cantilever, a membrane or a structure having any other shape, having a resonance frequency $f_r$.

In use, the mechanical oscillator 34 is actuated, for example according to an electrostatic, piezoelectric or electromagnetic actuation principle, so that the respective movable and/or deformable structure oscillates at an operating frequency $f_{op}$. In general, the operating frequency $f_{op}$ is a function of the resonance frequency $f_r$, for example it is equal to the resonance frequency $f_r$.

The mechanical oscillator 34 is configured in such a way that the physical quantity to be detected modifies the movement of the movable and/or deformable structure of the mechanical oscillator 34, for example modifies phase, amplitude and/or frequency thereof.

The sensing element 32 detects the movement of the movable and/or deformable structure of the mechanical oscillator 34, for example according to an electrostatic, piezoresistive, piezoelectric or electromagnetic detection principle, and converts it into the analog signal $S_A$.

The processing stage 31 of the main detector 22 receives the clock signal CLK and the analog signal $S_{A,s}$ and generates the output signal $S_O$. The output signal $S_O$ is obtained from the discretization of the analog signal $S_{A,s}$.

In detail, the processing stage 31 comprises an analog conditioning circuit or Analog Front-End (AFE) 40, an analog-to-digital converter 43, and a Digital Signal Processor (DSP) 46.

The analog front-end 40 comprises for example one or more operational amplifiers and is configured for example to filter, amplify or demodulate the analog signal $S_{A,s}$, providing a conditioned analog signal $S'_{A,s}$.

The analog-to-digital converter 43 receives the conditioned analog signal $S'_{A,s}$, the clock signal CLK and a main nominal rate signal $ODR_{N,s}$, and provides a sampled signal $S_{S,s}$.

The main nominal rate signal $ODR_{N,s}$ indicates the desired data rate of the sampled signal $S_{S,s}$ output from the analog-to-digital converter 43.

For example, the main nominal rate signal $ODR_{N,s}$ may indicate the nominal sampling frequency with which it is desired to discretize the conditioned analog signal $S'_{A,s}$.

The analog-to-digital converter 43 determines a main sampling frequency $f_{S,s}$ as a function of the clock frequency $f_{clk}$ and the main nominal rate $ODR_{N,s}$.

For example, the main nominal rate $ODR_{N,s}$ may indicate the desired sampling frequency as a function of a number of cycles of the clock signal CLK.

Therefore, the sampled signal $S_{S,s}$ has an effective data rate which depends on the clock frequency $f_{clk}$.

The main nominal rate signal $ODR_{N,s}$ may be received by the control unit 7, through the interface 10, for example as configuration signal CONF, and may be chosen for example by a user, depending on the specific application.

In case the detection unit 30 comprises the mechanical oscillator 34, for example in the case of a gyroscope, the main nominal rate $ODR_{N,s}$ is chosen in such a way that the main sampling frequency $f_{S,s}$ satisfies the Nyquist sampling theorem, for example greater than double the operating frequency $f_{op}$ of the mechanical oscillator 34 of the detection unit 30.

The DSP 46 processes the sampled signal $S_{S,s}$ and provides the output signal $S_O$. For example, the DSP 46 may filter the sampled signal $S_{S,s}$ or perform other operations on the sampled signal $S_{S,s}$, according to the specific application.

The DSP 46 may be controlled by the clock signal CLK.

Furthermore, the DSP 46 may receive one or more configuration parameters FLT, for example through the configuration signal CONF by the control unit 7, for example chosen by a user according to the specific application.

In practice, the sample rate of the output signal $S_O$ is also a function of the clock frequency $f_{clk}$.

According to a different embodiment, the main nominal rate signal $ODR_{N,s}$ may also indicate the desired data rate of the output signal $S_O$.

The reference detector 24 detects a power grid signal $S_g$ and provides a reference digital signal $S_{S,r}$ indicative of the acquired power grid signal $S_g$.

In detail, the reference detector 24 comprises a reference detection unit 50 which detects the power grid signal $S_g$ and generates one or more electrical signals, here an analog signal $S_{A,r}$, and a processing stage 51 which receives and samples the analog signal $S_{A,r}$ and generates the reference digital signal $S_{S,r}$.

The power grid signal, hereinafter also simply grid signal, $S_g$ is the signal of the main power supply, i.e., a periodic signal, for example sinusoidal, having a grid frequency $f_g$, for example equal to 50 Hz or 60 Hz. For example, the reference detection unit 50 may receive the grid signal $S_g$ from one or more electronic devices connected to the power grid and arranged in proximity of the electronic apparatus 1.

The reference detection unit 50 detects the grid signal $S_g$ in a wireless mode.

According to an embodiment, the reference detection unit 50 may comprise an element sensitive to a variation of electrostatic charge of the environment surrounding the sensor 5, caused by the grid signal $S_g$.

According to a different embodiment, the reference detection unit 50 may comprise an antenna or any other element sensitive to an electromagnetic field variation caused by the grid signal $S_g$.

The processing stage 51 of the reference detector 24 receives the clock signal CLK and the analog signal $S_{A,r}$ and generates the reference digital signal $S_{S,r}$, from the discretization of the analog signal $S_{A,r}$.

In detail, the processing stage 51 of the reference detector 24 comprises an analog conditioning circuit or Analog Front-End (AFE) 54 and an analog-to-digital converter 55.

The analog front-end 54 for example comprises one or more operational amplifiers and is configured for example to filter, amplify or demodulate the analog signal $S_{A,r}$, providing a conditioned analog signal $S'_{A,r}$.

The analog-to-digital converter 55 receives the conditioned analog signal $S'_{A,r}$, the clock signal CLK and a reference nominal rate signal $ODR_{N,r}$, and provides the reference digital signal $S_{S,r}$.

The reference nominal rate signal $ODR_{N,r}$ indicates the desired data rate of the reference digital signal $S_{S,r}$ output by the analog-to-digital converter 55.

For example, the reference nominal rate signal $ODR_{N,r}$ may indicate the nominal sampling frequency with which it is desired to discretize the conditioned analog signal $S'_{A,r}$.

The analog-to-digital converter 55 determines a reference sampling frequency $f_{S,r}$ as a function of the clock frequency $f_{clk}$ and the reference nominal rate $ODR_{N,r}$.

In this embodiment, the reference sampling frequency $f_{s,r}$ is equal to the main sampling frequency $f_{s,s}$.

For example, the reference nominal rate $ODR_{N,r}$ may indicate the desired sampling frequency as a function of a number of cycles of the clock signal CLK.

In practice, the reference digital signal $S_{S,s}$ has an effective sample rate which depends on the clock frequency $f_{clk}$.

The reference nominal rate signal $ODR_{N,r}$ may be received by the control unit 7, through the interface 10, for example as a configuration signal CONF, and may be chosen for example by a user, depending on the specific application.

The rate monitoring stage 26 comprises a rate estimation module 60 which receives the reference digital signal $S_{S,r}$ and an expected or nominal value signal EXP and provides a rate error signal ODR_ERR indicative of an error between the effective data rate $ODR_{eff,r}$ and the nominal data rate $ODR_{N,r}$ of the reference digital signal $S_{S,r}$.

The rate estimation module 60 may receive the expected value signal EXP from the control unit 7, as one of the configuration signals CONF, and is indicative of a nominal, or expected, digital frequency $\Omega_N$ of the reference digital signal $S_{S,r}$.

In this embodiment, the expected value signal EXP is indicative of both the nominal value of the grid frequency $f_g$, for example 50 Hz or 60 Hz, and the reference nominal data rate $ODR_{N,r}$.

The nominal digital frequency $\Omega_N$ of the reference digital signal $S_{S,r}$ is a function of the nominal data rate $ODR_{N,r}$ of the reference digital signal $S_{S,r}$ and the grid frequency $f_g$.

For example, the nominal digital frequency $\Omega_N$ of the reference digital signal $S_{S,r}$ may be defined as the ratio between the nominal grid frequency $f_g$ and the nominal data rate $ODR_{N,r}$, i.e., $\Omega_N = f_g / ODR_{N,r}$.

In practice, the expected or nominal value signal EXP is indicative of a nominal timing of the reference digital signal $S_{S,r}$.

The rate estimation module 60 compares the reference digital signal $S_{S,r}$ with the expected value signal EXP.

In detail, the rate estimation module 60 determines a timing parameter of the reference digital signal $S_{S,r}$, indicative of the effective digital frequency $\Omega_{eff}$ of the reference digital signal $S_{S,r}$. The effective digital frequency $\Omega_{eff}$ is indicative of the effective data rate $ODR_{eff}$ of the reference digital signal $S_{S,r}$ and the grid frequency $f_g$.

In response, the rate estimation module 60 provides an error signal ODR_ERR indicative of a difference or a ratio between the effective digital frequency $\Omega_{eff}$ and the nominal digital frequency $\Omega_N$ of the reference digital signal $S_{S,r}$.

In practice, the error signal ODR_ERR is indicative of a timing error of the reference digital signal $S_{S,r}$ with respect to the nominal value indicated by the expected or nominal value signal EXP.

Figures 3, 4:
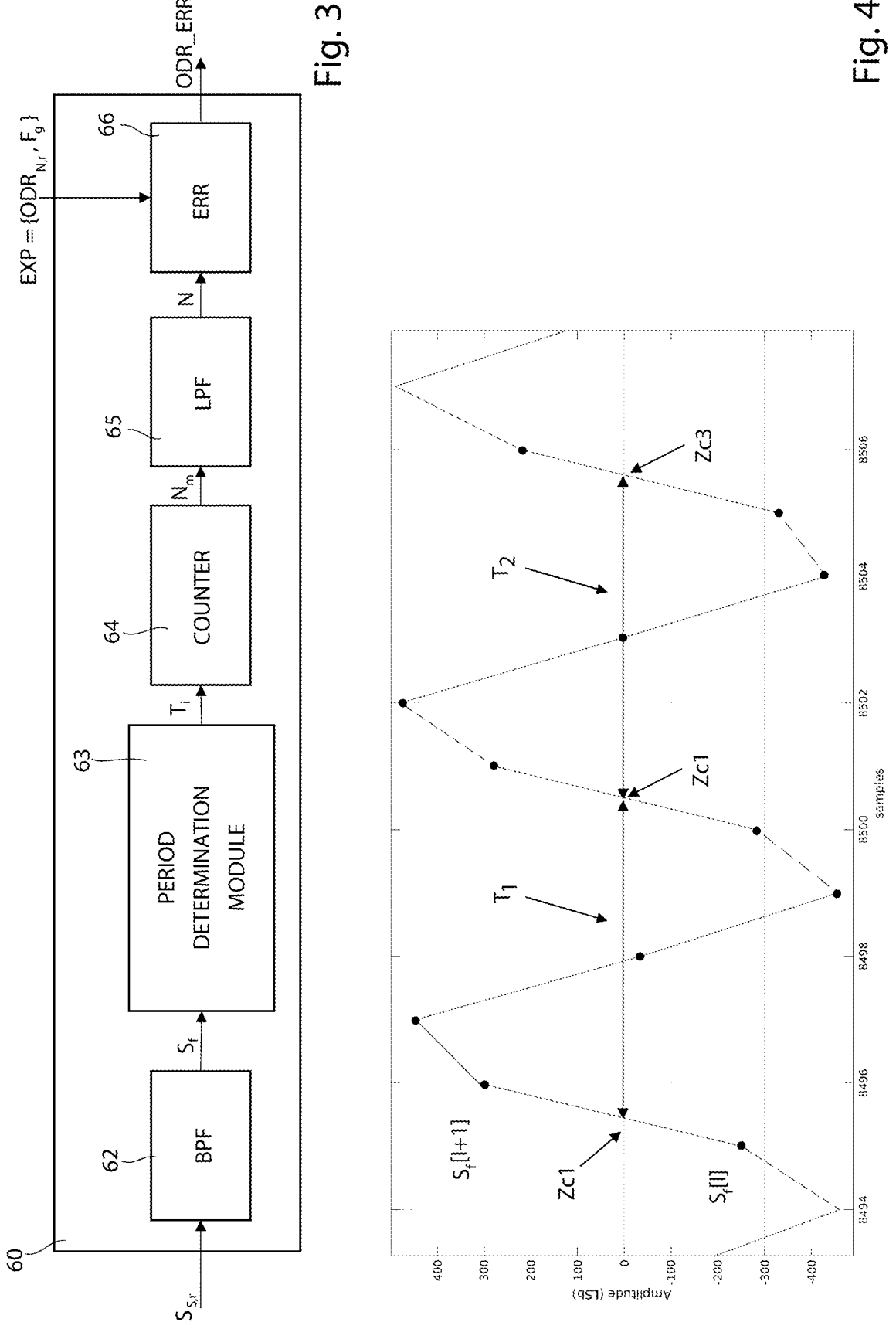
FIG. 3 shows a block diagram of a portion of the sensor of FIG. 2, according to an embodiment.
FIG. 4 shows a waveform of a signal of the sensor of FIG. 2, in use.

As shown in FIG. 3, in this embodiment, the rate estimation module 60 comprises a band-pass filter 62, a period determination module 63, a counter 64, a low-pass filter 65, and an error calculation module 66.

The band-pass filter 62 has a passband around the grid frequency $f_g$. The band-pass filter 62 receives the reference digital signal $S_{S,r}$ and provides a filtered signal $S_f$.

For example, the passband may be comprised between 45 Hz and 55 Hz or between 45 Hz and 65 Hz. The passband may be centered around the grid frequency $f_g$.

The period determination or detector module 63 receives the filtered signal $S_f$ and identifies one or more periods $T_i$ of the filtered signal $S_f$.

According to an embodiment, the period determination module 63 may determine a period of the filtered signal $S_f$ by detecting the zero crossings of the filtered signal $S_f$ i.e., of the detected power grid signal $S_g$.

According to a different embodiment, the period determination module 63 may determine a period of the filtered signal $S_f$ by detecting the peaks or the valleys of the filtered signal $S_f$ i.e., of the detected power grid signal $S_g$.

The period determination module 63 may be configured to reconstruct the filtered signal $S_f$ by interpolation, for example of linear type. By doing so, the period determination module 63 may detect a period of the filtered signal $S_f$, even if one or more samples of the filtered signal $S_f$ do not correspond to one of the zero crossings, peaks or valleys of the filtered signal $S_f$.

The counter 64 counts the number $N_m$ of samples of the filtered signal $S_f$ comprised in the period $T_i$ of the filtered signal $S_f$.

The low-pass filter 65 filters the number $N_m$ of samples and provides an average value N of samples per period of the filtered signal $S_f$.

According to a different embodiment, the counter 64 may count the number of samples $N_m$ within a time window having a width equal to a plurality of periods of the filtered signal $S_f$. By doing so, the number $N_m$ of samples output from the counter 64 may indicate an average value of samples per period of the filtered signal $S_f$. In this case, the low-pass filter 65 may be absent and the number $N_m$ output from the counter 64 may be provided directly to the error calculation module 66.

The error calculation module 66 receives the average value N and the expected signal EXP and determines the effective data rate $ODR_{eff,r}$ of the reference digital signal $S_{S,r}$.

The rate error signal ODR_ERR may be indicative of an absolute or relative error between the effective data rate $ODR_{eff,r}$ and the nominal data rate $ODR_{N,r}$ of the reference digital signal $S_{S,r}$.

FIG. 4 shows an exemplary waveform of the filtered signal $S_f$ having a plurality of samples $S_f[i]$. It is assumed, purely by way of example, that the nominal data rate $ODR_{N,r}$ of the reference digital signal $S_{S,r}$ is 240 Hz and that the grid frequency $f_g$ is 50 Hz.

Starting from the waveform of FIG. 4, the period determination module 63 identifies the zero crossings Zc1, Zc2, Zc3 that form a first and a second period $T_1$, $T_2$ of the filtered signal $S_f$.

In the example considered, the samples $S_f[i]$ of the filtered signal $S_f$ do not correspond to the zero crossings Zc1, Zc2, Zc3. For example, the zero crossing Zc1 is between a sample $S_f[I]$ and a subsequent sample $S_f[I+1]$.

In the example of FIG. 4, the counter 64 counts five samples in the first period $T_1$ and four samples in the second period $T_2$.

Let's assume that the counter 64 has determined, in a time window comprising a plurality of periods, that the average number $N_m$ of samples of the filtered signal $S_f$ in a period is equal to 5.1. Since the nominal grid frequency $f_g$ is equal to 50 Hz, the effective data rate $ODR_{eff}$ of the filtered signal $S_f$ is equal to 50·5.1=255 Hz. Consequently, the effective data rate $ODR_{eff}$ has an offset from the nominal data rate $ODR_{N,r}$ of about 6.2%.

In practice, in this embodiment, the number of samples per period of the filtered signal $S_f$ represents the effective timing parameter of the reference digital signal $S_{S,r}$.

The offset between the effective data rate $ODR_{eff}$ and the nominal data rate $ODR_{N,r}$ of the reference signal $S_{S,r}$ is due to an offset of the clock frequency $f_{clk}$ with respect to the respective design nominal value.

Consequently, the rate error module 60 allows detecting a timing error of the reference digital signal $S_{S,r}$, caused by a deviation of the clock 20 with respect to the design specifications.

Furthermore, since the clock frequency $f_{clk}$ is also used by the main detector 22 to provide the output signal $S_O$ from the analog signal $S_{A,s}$, the rate offset measured on the reference digital signal $S_{S,r}$ is also indicative of a rate offset of the output signal $S_O$ with respect to a nominal value.

In this embodiment, the error determination stage 26 also comprises a trimming module 70 which receives the error signal ODR_ERR and provides a trimming signal ODR_UPDATE to the clock 20.

The trimming signal ODR_UPDATE is indicative of a trimming value of the clock frequency $f_{clk}$.

The clock 20 receives the trimming signal ODR_UPDATE and, in response, modifies the clock frequency $f_{clk}$.

In practice, the trimming signal ODR_UPDATE is such as to trim the clock frequency $f_{clk}$ and therefore to compensate for the difference between the effective data rate $ODR_{eff}$ and the nominal data rate $ODR_{N,r}$ of the filtered signal $S_f$.

Since the clock signal CLK is also used by the main detector 22 to determine the sample rate of the sensing digital signal $S_{S,s}$, and thus of the output signal $S_O$, a variation of the clock frequency $f_{clk}$ also allows the data rate of the output signal $S_O$ to be modified.

In practice, the error determination stage 26 may allow not only to detect, but also to correct, a possible offset of the data rate of the output signal $S_O$ from the nominal value.

In fact, during the lifetime of the sensor 5, the clock frequency $f_{clk}$ may be subject to deviations caused by temperature variations or aging of the clock 20. Such deviations produce an offset in the data rate of the output signal $S_O$ from the nominal value.

In practice, the sensor 5 exploits the stability of the grid frequency $f_g$ as a reference to measure, and optionally correct, deviations of the clock 20 from design specifications.

The fact that the sensor 5 uses the reference detector 24 to measure an offset of the output data rate of the output signal $S_O$, means that the measurement of the effective data rate may be performed during the operation of the sensor 5, without interrupting it, and without resorting to complex calibration procedures.

Furthermore, also the correction of the data rate performed by the trimming module 70 may be carried out during the use of the sensor 5, without interrupting the operation thereof.

With reference to FIG. 2, according to a different embodiment, the DSP 46 of the main detector 22 may also be configured to perform a resampling of the digital signal $S_{S,s}$. For example, the DSP 46 may be configured to interpolate and/or decimate the digital signal $S_{S,s}$, so that the output signal $S_O$ has a different data rate from that of the digital signal $S_{S,s}$.

For example, the DSP 46 may be configured to perform an integer or fractional resampling of the digital signal $S_{S,s}$.

In this case, the trimming module 70 may provide the trimming signal ODR_UPDATE to the DSP 46, instead of the clock 20, as indicated by a dashed line in FIG. 2. The DSP 46, in response to the trimming signal ODR_UPDATE, modifies the data rate of the digital signal $S_{S,s}$ so as to compensate for the error introduced by the deviation of the clock frequency $f_{clk}$ with respect to the nominal value. Such an embodiment may be advantageous, for example, if the frequency of the clock signal CLK cannot be modified.

Figure 5:
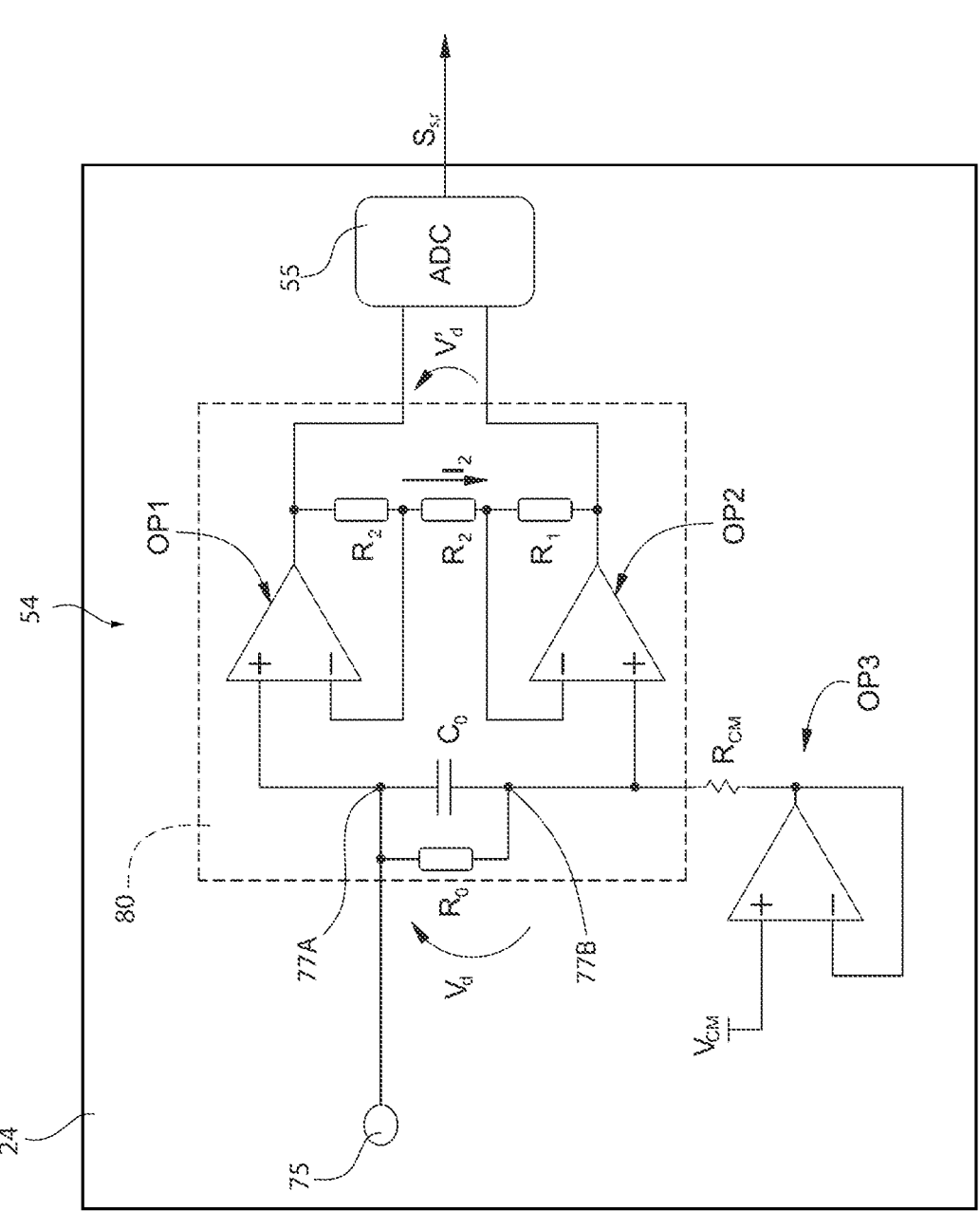
FIG. 5 shows a detailed circuit diagram of a different portion of the sensor of FIG. 2, according to an embodiment.

FIG. 5 shows in detail a circuit diagram of an embodiment of the reference detector 24, based on the detection of electrostatic charge variation induced by the grid signal $S_g$.

In this embodiment, the reference detection unit 50 of FIG. 2 is formed by one or more electrodes, here one electrode 75, forming the element sensitive to an electrostatic charge variation.

The electrode 75 may be integrated into the case of the electronic apparatus 1.

For example, the electrode 75 may be arranged so as to be in direct electrical contact with a part of the body of an external user of the electronic apparatus 1, for example a hand or a finger.

The electrode 75 may be a metal surface or an electrode coated with dielectric material or a metal surface placed under the case of the device integrating it, and is configured to pick up the external charge.

The electrode 75 accumulates an amount of electrostatic charge which is a function of the trend over time of the grid signal $S_g$.

In this embodiment, as shown in FIG. 5, the analog front-end 54 comprises an instrumentation amplifier 80 having a first input 77A, electrically coupled to the electrode 75, and a second input 77B, electrically coupled to the first input 77A by a resistor $R_0$ and a capacitor $C_0$ in parallel with each other. The resistor $R_0$ and the capacitor $C_0$ have the function of accumulating the charges picked up by the electrode 75 and managing the band of the input signal (to filter signals and noises at an undesired frequency).

An input voltage $V_d$, associated with the electrostatic charge variation and therefore with the trend of the grid signal $S_g$, is therefore generated between the first input 77A and the second input 77B. In this embodiment, the input voltage $V_d$ forms the analog signal $S_{A,r}$ of the reference detector 24.

The values of the capacitance of $C_0$ and of the resistance of $R_0$ may be chosen as a function of the type of filter that it is desired to form, for example a low-pass filter, with a cut-off frequency higher than the grid frequency $f_g$.

For example, the capacitance of $C_0$ is chosen in the range 5 pF-5 nF. For example, the resistance of $R_0$ is chosen in the range 500 MOhm-50 GOhm.

The values of the capacitance of $C_0$ and of the resistance of $R_0$ may also be chosen as a function of the impedance of the stage whereto they are connected, the useful frequency of the input voltage $V_d$ and that of the interferences to be filtered, for example the high-frequency electrical noises of the power supply circuits, etc.

The instrumentation amplifier 80 here includes two operational amplifiers OP1 and OP2.

The analog front-end 54 also comprises a biasing stage (buffer) OP3 used to bias the instrumentation amplifier 80 to a common mode voltage $V_{CM}$.

The inverting terminals of the operational amplifiers OP1 and OP2 are connected to each other through a resistor $R_2$.

Since the two inputs of each operational amplifier OP1, OP2 are to be at the same potential, the input voltage $V_d$ is also applied across $R_2$ and causes, through this resistor $R_2$, a current equal to $I_2=V_d/R_2$. The current $I_2$ does not come from the input terminals of the operational amplifiers OP1, OP2 and therefore flows through the two resistors $R_1$ connected between the outputs of the operational amplifiers OP1, OP2, in series with the resistor $R_2$; therefore, the current $I_2$ flowing through the series of the three resistors $R_1$-$R_2$-$R_1$ produces an output voltage $V'_d$ given by $V'_d=I_2\cdot(2R_1+R_2)=V_d\cdot(1+2R_1/R_2)$. Therefore, the overall gain of the circuit of FIG. 5 is $A_d=(1+2R_1/R_2)$. The differential gain depends on the value of the resistor $R_2$ and may therefore be modified by acting on the resistor $R_2$.

The output voltage $V'_d$, which is thus proportional to the input voltage $V_d$ between the first and the second inputs 77A, 77B, is provided at input to the analog-to-digital converter 55, which provides at output the reference digital signal $S_{S,r}$. In practice, in this embodiment, the output voltage $V'_d$ forms the conditioned analog signal $S'_{A,r}$ of the reference detector 24.

Figures 6, 7:
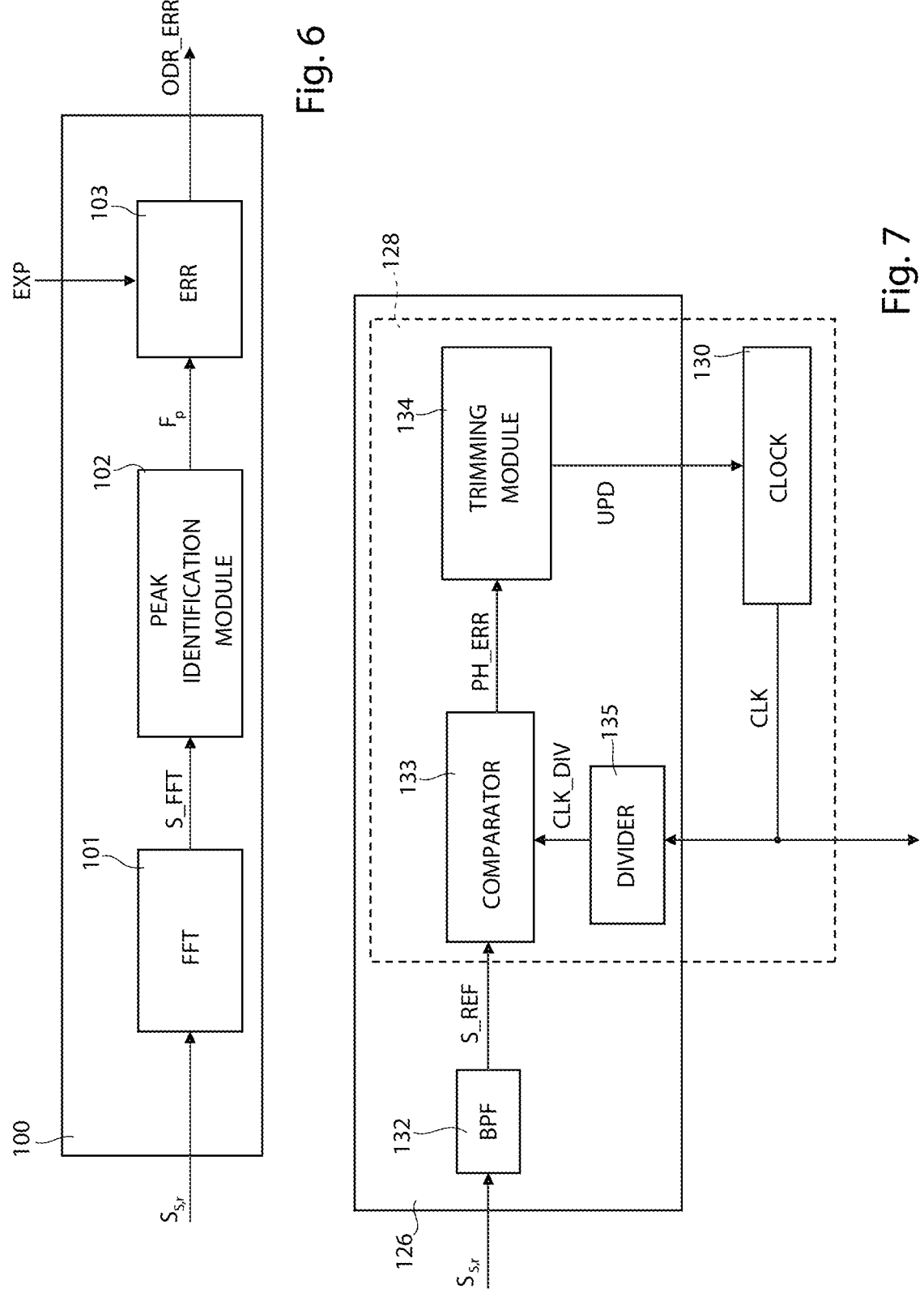
FIG. 6 shows a block diagram of the portion of FIG. 3, according to a different embodiment.
FIG. 7 shows a block diagram of a further portion of the sensor of FIG. 2, according to a further embodiment.

FIG. 6 shows a different embodiment of the rate estimation module, here indicated by 100, of FIG. 2.

The rate estimation module 100 comprises an FFT module 101, a peak identification or detection module 102 and an error calculation module, here indicated by 103.

The FFT module 101 receives the reference digital signal $S_{S,r}$ and calculates the Fourier transform thereof, providing at output a transform signal S_FFT.

The peak identification module 102 determines a peak frequency $F_p$ corresponding to a maximum value of the transform signal S_FFT generated from the grid signal $S_g$. In particular, the peak identification module 102 may be configured to search for the peak frequency $F_p$ around the nominal digital frequency $\Omega_N$ of the reference digital signal $S_{S,r}$.

The peak frequency $F_p$ thus identified is the effective digital frequency $\Omega_{eff}$ of the reference digital signal $S_{S,r}$.

In practice, in this embodiment, the peak frequency $F_p$ represents the effective timing parameter of the reference digital signal $S_{S,r}$.

The error calculation module 103 compares the effective digital frequency $\Omega_{eff}$ of the reference digital signal $S_{S,r}$ with the nominal digital frequency $\Omega_N$ of the reference digital signal $S_{S,r}$ and provides in response the rate error signal ODR_ERR.

For example, by considering the nominal digital frequency $\Omega_N=f_g/ODR_{N,r}=50/240=0.208$ and a measured effective digital frequency equal to $\Omega_{eff}=0.195$, the rate error signal ODR_ERR may indicate an offset equal to about 6.2% between the nominal data rate $ODR_{N,r}$ and the effective data rate $ODR_{eff}$.

The trimming module 70 may therefore compensate for this rate offset, as discussed above.

FIG. 7 shows a different embodiment of the monitoring stage, here indicated by 126, of the sensor 5.

The monitoring stage 126 forms a Phase-Locked Loop (PLL) or circuit 128, indicated in FIG. 7 by a dashed line, which synchronizes the clock, here a voltage-controlled oscillator (VCO) 130, with the reference digital signal $S_{S,r}$.

In detail, the monitoring stage 126 comprises a band-pass filter 132, having a passband around the grid frequency $f_g$, which receives the reference digital signal $S_{S,r}$ and generates a time reference signal S_REF.

The PLL 128 comprises a comparator 133, a trimming module, here indicated by 134, and a frequency divider 135.

The frequency divider 135 generates a comparison signal CLK_DIV, from the clock signal CLK, having a lower frequency than the clock frequency $f_{clk}$.

The comparator 133 receives the time reference signal S_REF and the comparison signal CLK_DIV and generates a phase error signal PH_ERR indicative of a phase shift between the time reference signal S_REF and the clock signal CLK.

The trimming module 134 receives the phase error signal PH_ERR and provides a correction signal UPD configured to compensate for the phase shift between the time reference signal S_REF and the clock signal CLK.

The clock 130, in response to receiving the correction signal UPD, modifies the phase of the clock signal CLK, so that the clock signal CLK is synchronized to the time reference signal S_REF.

For example, the PLL 128 may be configured to synchronize a rising edge of the clock signal CLK with a zero crossing of the time reference signal S_REF.

In practice, in this embodiment, the comparison signal CLK_DIV is indicative of a nominal timing.

In this embodiment, the PLL 126 determines the phase error PH_ERR as a timing error, from the clock signal CLK and the reference digital signal $S_{S,r}$.

In practice, in this embodiment, the power grid signal $S_g$ may therefore be used as a reference to lock, in phase and in frequency, the comparison signal CLK_DIV (and therefore the clock signal CLK).

In case the electronic apparatus 1 comprises further sensors, in addition to the sensor 5, the clock signal CLK may also be provided to said further sensors and be used therefrom as a clock signal. In practice, the sensors may provide the respective output signals mutually synchronized.

Finally, it is clear that modifications and variations may be made with respect to what has been described and illustrated herein, without thereby departing from the scope of the present disclosure.

According to an embodiment, as shown by a dashed line in FIG. 1, the sensor 5 may provide the rate error signal ODR_ERR to the control unit 7, for example through the interface 10. The control unit 7 may use the rate error signal ODR_ERR when processing the output signal $S_O$, for example to correct a possible offset of the data rate. In this case, the error determination stage 26 of the sensor 5 may comprise the rate estimation module 60, 100 of FIGS. 3, 6 and not the trimming module 70.

The rate estimation module may be configured to detect the offset of the effective rate from the nominal rate in a different way. For example, the rate estimation module may perform a correlation measurement of the reference digital signal $S_{S,r}$. In this case, the rate estimation module may generate an internal comparison signal, from the clock signal CLK, having a frequency equal to the grid frequency $f_g$. For example, the internal comparison signal may be a sinusoid. The rate estimation module performs a measurement of the correlation between the internal comparison signal and the reference digital signal $S_{S,r}$ and, in response, modifies the frequency of the clock signal CLK so as to maximize the correlation between the internal comparison signal and the reference digital signal $S_{S,r}$. In practice, the internal comparison signal may be indicative of a nominal timing and said correlation measurement may be used as a timing error between the reference digital signal $S_{S,r}$ and the internal comparison signal.

The main detector 22 and the reference detector 24 may be formed in a same die of semiconductor material or each in a respective die. In particular, the clock, the rate error correction stage and the processing stages 31, 51 may be integrated in a same die. Alternatively, in the sensor the analog components, for example the analog front-end 40, 54, may be formed in a different die with respect to the digital components, for example the clock 20 and the error determination stage 26.

For example, the different embodiments described may be combined to provide further solutions.

All or part of the operations performed by the processing stage 31, 51 and by the error stage 26 may be obtained both by using a hardware solution, through dedicated circuits, and by using a software solution, through dedicated computer programs.

Each of the various blocks, stages, and units discussed above may be implemented by circuitry. The functions of the various blocks, stages, and units may also by a processor of executing a program, which is stored in a memory coupled to the processor.

An integrated sensor (5) may be summarized as including a clock (20; 130) configured to provide a clock signal (CLK) having a clock frequency ($f_{clk}$); a digital detector (24) configured to detect a power grid signal ($S_g$) and generate a reference digital signal ($S_{S,r}$) indicative of the power grid signal and having a sample rate which is a function of the clock frequency; and a timing monitoring stage (26; 126) configured to receive the reference digital signal ($S_{S,r}$) and a nominal signal (EXP; CLK_DIV) indicative of a nominal timing ($f_g$, $ODR_{N,r}$, $\Omega_N$) of the reference digital signal, to compare the reference digital signal with the nominal signal (EXP; CLK_DIV) and, in response, to provide an error signal (ODR_ERR; PH_ERR) indicative of a timing error between the reference digital signal and the nominal signal.

The digital detector may include a detection unit (50) configured to detect, wirelessly, the power grid signal ($S_g$) and generate an analog signal ($S_{A,r}$) indicative of the detected power grid signal, and an analog-to-digital conversion stage (51) configured to receive and discretize the analog signal based on the clock signal (CLK).

The detection unit (50) may include an electrode (75) sensitive to a variation of electrostatic charge caused by the power grid signal.

The nominal signal (EXP) may be indicative of a nominal digital frequency ($\Omega_N$) of the reference digital signal ($S_{S,r}$), the nominal digital frequency being a function of a nominal data rate ($ODR_{N,r}$) of the reference digital signal and of a grid frequency ($f_g$) of the power grid signal ($S_g$), the timing monitoring stage (26) comprising an estimation module (60; 100) configured to determine, from the reference digital signal, a timing parameter (N, $F_p$) indicative of an effective digital frequency ($\Omega_{eff}$) of the reference digital signal, the effective digital frequency being a function of an effective data rate ($ODR_{eff, r}$) of the reference digital signal and of the grid frequency ($f_g$) of the power grid signal, the timing error being indicative of a difference between the effective digital frequency and the nominal digital frequency.

The timing parameter may be indicative of a number of samples per period of the reference digital signal, the estimation module (60) comprising a processing module (62, 63) configured to detect a period of the reference digital signal and a counting module (64, 65) configured to determine the number of samples (N, $N_m$) per period of the reference digital signal.

The processing module (63) may be configured to detect a period of the reference digital signal by detecting one of zero crossings, peaks and valleys of the reference digital signal.

The timing parameter may be indicative of a peak frequency of a spectrum of the reference digital signal, the estimation module (100) being configured to perform a frequency analysis of the reference digital signal and to detect the peak frequency ($F_p$) based on a result of the frequency analysis.

The timing monitoring stage (126) may form a phase-locked circuit (128) comprising the clock (130), wherein the nominal signal is the clock signal and the phase-locked circuit is configured to use the reference digital signal as locking signal for the clock signal.

The digital detector may be a first digital detector, the integrated sensor further comprising a second digital detector (22) configured to detect a physical quantity and provide an output digital signal ($S_{S,s}$, $S_O$) indicative of the detected physical quantity and having a sample rate which is a function of the clock frequency.

The timing monitoring stage may include a trimming module (70; 134) configured to receive the error signal (ODR_ERR; PH_ERR) and to provide a trimming signal (UPDATE_ODR; UPD) configured to compensate for the timing error.

The second digital detector (46, 22) may be configured to receive the trimming signal and, in response, to modify the sample rate of the output digital signal.

The clock may be configured to receive the trimming signal and, in response, to modify the frequency of the clock signal.

A method of timing monitoring in an integrated sensor, may be summarized as including generating a clock signal (CLK) having a clock frequency; generating a reference digital signal ($S_{S,r}$) indicative of a detected power grid signal ($S_g$) and having a sample rate which is a function of the clock frequency; comparing the reference digital signal with a nominal signal (EXP; CLK, CLK_DIV) indicative of a nominal timing of the reference digital signal; and providing an error signal (ODR_ERR) indicative of a timing error between the reference digital signal and the nominal signal, in response to the comparison between the reference digital signal and the nominal signal.

The nominal signal (EXP) may be indicative of a nominal digital frequency (ON) of the reference digital signal ($S_{S,r}$), the nominal digital frequency being a function of a nominal data rate ($ODR_{N,r}$) of the reference digital signal and of a grid frequency ($f_g$) of the power grid signal ($S_g$), wherein comparing the reference digital signal with the nominal signal comprises determining, from the reference digital signal, a timing parameter (N, $F_p$) indicative of an effective digital frequency ($\Omega_{eff}$) of the reference digital signal, the effective digital frequency being a function of an effective data rate ($ODR_{eff, r}$) of the reference digital signal and of the grid frequency ($f_g$) of the power grid signal, the timing error being indicative of a difference between the effective digital frequency and the nominal digital frequency.

The method may further include providing a trimming signal (ODR_UPDATE; UPD) as a function of the error signal, the trimming signal being configured to compensate for the timing error.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated sensor, comprising:
a clock configured to provide a clock signal having a clock frequency;
a digital detector configured to:
detect a power grid signal; and
generate a reference digital signal indicative of the power grid signal and having a sample rate which is a function of the clock frequency; and
a timing monitor configured to:
receive the reference digital signal and a nominal signal indicative of a nominal timing of the reference digital signal in order to compare the reference digital signal with the nominal signal, the nominal signal being indicative of a nominal digital frequency of the reference digital signal, the nominal digital frequency being a function of a nominal data rate of the reference digital signal and of a grid frequency of the power grid signal; and
in response to the comparison, provide an error signal indicative of a timing error between the reference digital signal and the nominal signal,
the timing monitor including an estimator configured to determine, from the reference digital signal, a timing parameter indicative of an effective digital frequency of the reference digital signal, the effective digital frequency being a function of an effective data rate of the reference digital signal and of the grid frequency of the power grid signal, the timing error being indicative of a difference between the effective digital frequency and the nominal digital frequency.

2. The integrated sensor according to claim 1, wherein the digital detector includes:
a reference detector configured to wirelessly detect the power grid signal, and generate an analog signal indicative of the detected power grid signal; and
an analog-to-digital converter configured to receive and discretize the analog signal based on the clock signal.

3. The integrated sensor according to claim 2, wherein the reference detector includes an electrode sensitive to a variation of electrostatic charge caused by the power grid signal.

4. The integrated sensor according to claim 1, wherein
the timing parameter is indicative of a number of samples per period of the reference digital signal, and
the estimator includes:

a period detector configured to detect a period of the reference digital signal; and
a counter configured to determine the number of samples per period of the reference digital signal.

5. The integrated sensor according to claim 4, wherein the period detector is configured to detect a period of the reference digital signal by detecting one of zero crossings, peaks, or valleys of the reference digital signal.

6. The integrated sensor according to claim 1, wherein
the timing parameter is indicative of a peak frequency of a spectrum of the reference digital signal, and
the estimator is configured to perform a frequency analysis of the reference digital signal, and detect the peak frequency based on a result of the frequency analysis.

7. The integrated sensor according to claim 1, wherein
the timing monitor includes a phase-locked circuit including the clock,
the nominal signal is the clock signal, and
the phase-locked circuit is configured to use the reference digital signal as a locking signal for the clock signal.

8. The integrated sensor according to claim 1, wherein
the digital detector is a first digital detector,
the integrated sensor includes a second digital detector configured to:
detect a physical quantity; and
provide an output digital signal indicative of the detected physical quantity and having a sample rate which is a function of the clock frequency.

9. The integrated sensor according to claim 8, wherein the timing monitor includes a trimming module configured to:
receive the error signal; and
provide a trimming signal configured to compensate for the timing error.

10. The integrated sensor according to claim 9, wherein the second digital detector is configured to:
receive the trimming signal; and
in response to the trimming signal being received, modify the sample rate of the output digital signal.

11. The integrated sensor according to claim 9, wherein the clock is configured to:
receive the trimming signal; and
in response to the trimming signal being received, modify the clock frequency of the clock signal.

12. A method, comprising:
generating, by a clock, a clock signal having a clock frequency;
detecting, by a digital detector, a power grid signal;
generating, by the digital detector, a reference digital signal indicative of the detected power grid signal and having a sample rate which is a function of the clock frequency;
comparing, by a timing monitor, the reference digital signal with a nominal signal indicative of a nominal timing of the reference digital signal, the nominal signal is indicative of a nominal digital frequency of the reference digital signal, the nominal digital frequency being a function of a nominal data rate of the reference digital signal and of a grid frequency of the power grid signal; and
providing, by the timing monitor, an error signal indicative of a timing error between the reference digital signal and the nominal signal, in response to the comparison between the reference digital signal and the nominal signal,
comparing the reference digital signal with the nominal signal includes determining, from the reference digital signal, a timing parameter indicative of an effective digital frequency of the reference digital signal, the effective digital frequency being a function of an effective data rate of the reference digital signal and of the grid frequency of the power grid signal, the timing error being indicative of a difference between the effective digital frequency and the nominal digital frequency.

13. The method according to claim 12, further comprising:
   providing a trimming signal as a function of the error signal, the trimming signal being configured to compensate for the timing error.

14. A device, comprising:
   a clock configured to generate a clock signal having a clock frequency;
   a reference detector configured to detect electrostatic charge variation of a power grid signal, and generate a reference digital signal based on the electrostatic charge variation and the clock signal; and
   a rate monitor configured to:
      receive a nominal value signal indicative of a nominal digital frequency of the reference digital signal;
      determine an effective digital frequency of the reference digital signal;
      determine a difference between the effective digital frequency and the nominal digital frequency; and
      change the clock frequency based on the difference between the effective digital frequency and the nominal digital frequency.

15. The device of claim 14, wherein the reference digital signal has a sample rate that is a function of the clock frequency.

16. The device of claim 14, wherein the nominal digital frequency is a function of a nominal data rate of the reference digital signal and of a grid frequency of the power grid signal.

17. The device of claim 14, wherein the effective digital frequency is a function of an effective data rate of the reference digital signal and of a grid frequency of the power grid signal.

18. The device of claim 14, wherein
   the rate monitor is configured to generate a trimming signal that is a function of the difference between the effective digital frequency and the nominal digital frequency,
   the trimming signal is indicative of a trimming value of the clock frequency, and
   the clock frequency is changed based on the trimming signal.

19. An integrated sensor, comprising:
   a clock configured to provide a clock signal having a clock frequency;
   a first digital detector configured to:

detect a power grid signal; and
generate a reference digital signal indicative of the power grid signal and having a sample rate which is a function of the clock frequency; and
a timing monitor configured to:
   receive the reference digital signal and a nominal signal indicative of a nominal timing of the reference digital signal in order to compare the reference digital signal with the nominal signal; and
   in response to the comparison, provide an error signal indicative of a timing error between the reference digital signal and the nominal signal,
   the timing monitor including a trimming module configured to:
      receive the error signal; and
      provide a trimming signal configured to compensate for the timing error; and
a second digital detector configured to:
   detect a physical quantity;
   provide an output digital signal indicative of the detected physical quantity and having a sample rate which is a function of the clock frequency;
   receive the trimming signal; and
   in response to the trimming signal being received, modify the sample rate of the output digital signal.

20. An integrated sensor, comprising:
a clock configured to provide a clock signal having a clock frequency;
a digital detector configured to:
   detect a power grid signal; and
   generate a reference digital signal indicative of the power grid signal and having a sample rate which is a function of the clock frequency; and
a timing monitor configured to:
   receive the reference digital signal and a nominal signal indicative of a nominal timing of the reference digital signal in order to compare the reference digital signal with the nominal signal; and
   in response to the comparison, provide an error signal indicative of a timing error between the reference digital signal and the nominal signal,
the timing monitor including a trimming module configured to:
   receive the error signal; and
   provide a trimming signal configured to compensate for the timing error,
the clock is configured to:
   receive the trimming signal; and
   in response to the trimming signal being received, modify the clock frequency of the clock signal.

* * * * *